United States Patent
Ohtake et al.

(10) Patent No.: US 6,463,007 B2
(45) Date of Patent: *Oct. 8, 2002

(54) SYNCHRONOUS SEMICONDUCTOR MEMORY DEVICE

(75) Inventors: Hiroyuki Ohtake, Tokyo-To (JP); Shigeo Ohshima, Yokohama (JP)

(73) Assignee: Kabushiki Kaisha Toshiba, Kawasaki (JP)

(*) Notice: Subject to any disclaimer, the term of this patent is extended or adjusted under 35 U.S.C. 154(b) by 0 days.

This patent is subject to a terminal disclaimer.

(21) Appl. No.: 09/934,691

(22) Filed: Aug. 23, 2001

(65) Prior Publication Data

US 2002/0001254 A1 Jan. 3, 2002

Related U.S. Application Data

(63) Continuation of application No. 09/526,212, filed on Mar. 15, 2000, now Pat. No. 6,292,430.

(30) Foreign Application Priority Data

Mar. 16, 1999 (JP) .............................. 11-70879

(51) Int. Cl.[7] .................................................. G11C 8/00
(52) U.S. Cl. ........................................ 365/233; 365/191
(58) Field of Search ................... 365/233, 191, 365/230.01, 189.01

(56) References Cited

U.S. PATENT DOCUMENTS

| 5,581,512 A | 12/1996 | Kitamura |
| 5,600,605 A | 2/1997 | Schaefer |
| 5,848,024 A | 12/1998 | Cho |
| 6,064,625 A | 5/2000 | Tomita |

FOREIGN PATENT DOCUMENTS

JP 9-293378 11/1997

*Primary Examiner*—Hoai Ho
(74) *Attorney, Agent, or Firm*—Finnegan, Henderson, Farabow, Garrett & Dunner, L.L.P.

(57) ABSTRACT

A synchronous semiconductor memory device such as SDRAM easy in timing adjustment of column selection and capable of reducing cycle time and access time to be minimum value without reducing access margin is provided. The synchronous semiconductor memory device includes a memory cell array constituted in a matrix form, a command decoder and an address buffer operative in synchronism with the leading end of clock signal, a row decoder for decoding row address to select word line of the memory cell, a column control signal generating circuit for generating a column control signal, and a column decoder for taking thereinto column address taken in by the address buffer by a column address taking-in signal generated from the command decoder in synchronism with the leading end of the clock signal to allow a column select signal line to be active.

1 Claim, 8 Drawing Sheets

SYNCHRONOUS SEMICONDUCTOR MEMORY DEVICE

This is a continuation of parent application Ser. No. 09/526,212, filed Mar. 15, 2000 now U.S. Pat. No. 6,292,430. The contents of this parent application being relied upon and incorporated by reference herein.

BACKGROUND OF THE INVENTION

This application is based upon and claims the benefit of priority from the prior Japanese Patent Application No. H11-070879, filed on Mar. 16, 1999 the entire contents of which are incorporated herein by reference.

This invention relates to a synchronous semiconductor memory device such as a synchronous DRAM, etc. in which data read and write operations are synchronously controlled by clock signals.

In a synchronous DRAM (SDRAM), commands and/or addresses are taken thereinto in synchronism with a clock signal and read/write operations of data are carried out in accordance with read/write control signals. For example, at the time of data read operation, data on a bit line of a memory cell array is selected by a column decoder and is transferred to a data line. At this time, in the column decoder controlled by the clock signals, a column select clock signal corresponding to an established internal column address is supplied thereto and a column select line for transferring the selected data on the bit line to the data line is caused to be active.

For a time period during which an address is taken in after a READ command is established and is decoded so that internal column address is established, there exists a predetermined delay time because data is passed through many gates. The number of gate stages of the clock system to generate a column control clock signal for allowing a column select signal to be active in accordance with the a command from an internal clock signal generated by taking an external clock signal thereinto is smaller than that of the above-described address system. Accordingly, in order that the column control clock signal is caused to be generated after the internal column address is established, an approach where a predetermined delay is given to the generation path of column control clock signal.

In more practical sense, the delay time from the time when the external address is taken in to the time when the internal column address is established and the delay time for generating the column select clock signal in response to the READ command are both determined with rising edge of the clock signal being as a reference timing. If a delay time of the column select clock signal is adjusted in order that the column select clock signal is generated substantially simultaneously with establishment of the internal column address and is delivered to the final stage of the column decoder, an access time from command input to data output becomes minimum.

However, in practice, since transfer paths for address and clock signal are different as described above, it is difficult to optimumly carry out timing adjustment. For this reason, such an approach has been generally carried out to give delay time longer than the internal column address establishment time so that erroneous column selection is securely prevented. This constitutes the cause to impede more shortening of access time.

In addition, when an order of timings of the internal column address establishment and of generation of the column select clock signal are reversed because of any causes such as variations in process, even if the period of clock signal delivered is elongated to elongate the cycle time, the above-supplied timing relationship will not be changed, resulting in that there is no relief measure. This is because the time required for establishment of the internal column address and the time required for generation of the column select clock signal are both determined with rising edge of clock signal being as reference as described above.

SUMMARY OF THE INVENTION

This invention has been made in view of circumstances as described above, and its object is to provide a synchronous semiconductor memory device which is easy in timing adjustment of column selection and permitting to make cycle time and access time minimum without decreasing access margin.

According to one aspect of the present invention, there is provided a synchronous semiconductor memory device comprising:

a memory cell array having memory cells disposed in matrix form and operating on the basis of a clock signal;

a plurality of word lines;

a plurality of column lines;

a row decoder for designating address of the word lines;

a column control signal generating circuit for generating a column control signal; and a column decoder for designating address of the column lines wherein taking-in said column address is performed in synchronism with a leading end of the clock signal and the column control signal is generated in synchromism with a trailing end of the clock signal.

According to another aspect of the present invention, there is provided a synchronous semiconductor memory device comprising:

a memory cell array having memory cells, in which bit lines and word lines are disposed in an intersecting manner and the memory cells are disposed as respective intersecting portions;

a command decoder for decoding command which designates operation mode in synchronism with the leading end of a clock signal;

an address buffer for taking address thereinto in synchronism with the leading end of the clock signal;

a row decoder for decoding row address taken in by the address buffer to select word line of the memory cell array;

a column control signal generating circuit for generating a column control signal in synchronism with a trailing end of the clock signal on the basis of read control signal decoded by the command decoder; and a column decoder for taking thereinto column address taken in by the address buffer by a column address taking-in signal generated from the command decoder in synchronism with the leading end of the clock signal to allow a column select signal line to be active, the column select signal line serving to select bit line of the memory cell array on the basis of column control signal generated from the column control signal generating circuit.

In accordance with this invention, such an approach is employed to carry out taking-in of column address in synchronism with the leading end of a clock signal, and to generate a column control signal for decoding the column address thus taken in to allow column select line to be active in synchronism with the trailing end of the clock signal. Thus, by adjusting period of the clock signal, adjustments of the timing of internal column address establishment and the timing of column control signal can be carried out. As a result, access time and cycle time can be shortened without decreasing access margin.

BRIEF DESCRIPTION OF THE DRAWINGS

In the attached drawings,

FIG. 10 is a circuit diagram showing the detailed construction of the column clock controller shown in FIGS. 1, 3 and 9.

DESCRIPTION OF THE PREFERRED EMBODIMENTS

Preferred embodiments of this invention will now be described with reference to the attached drawings.

Figure 1:
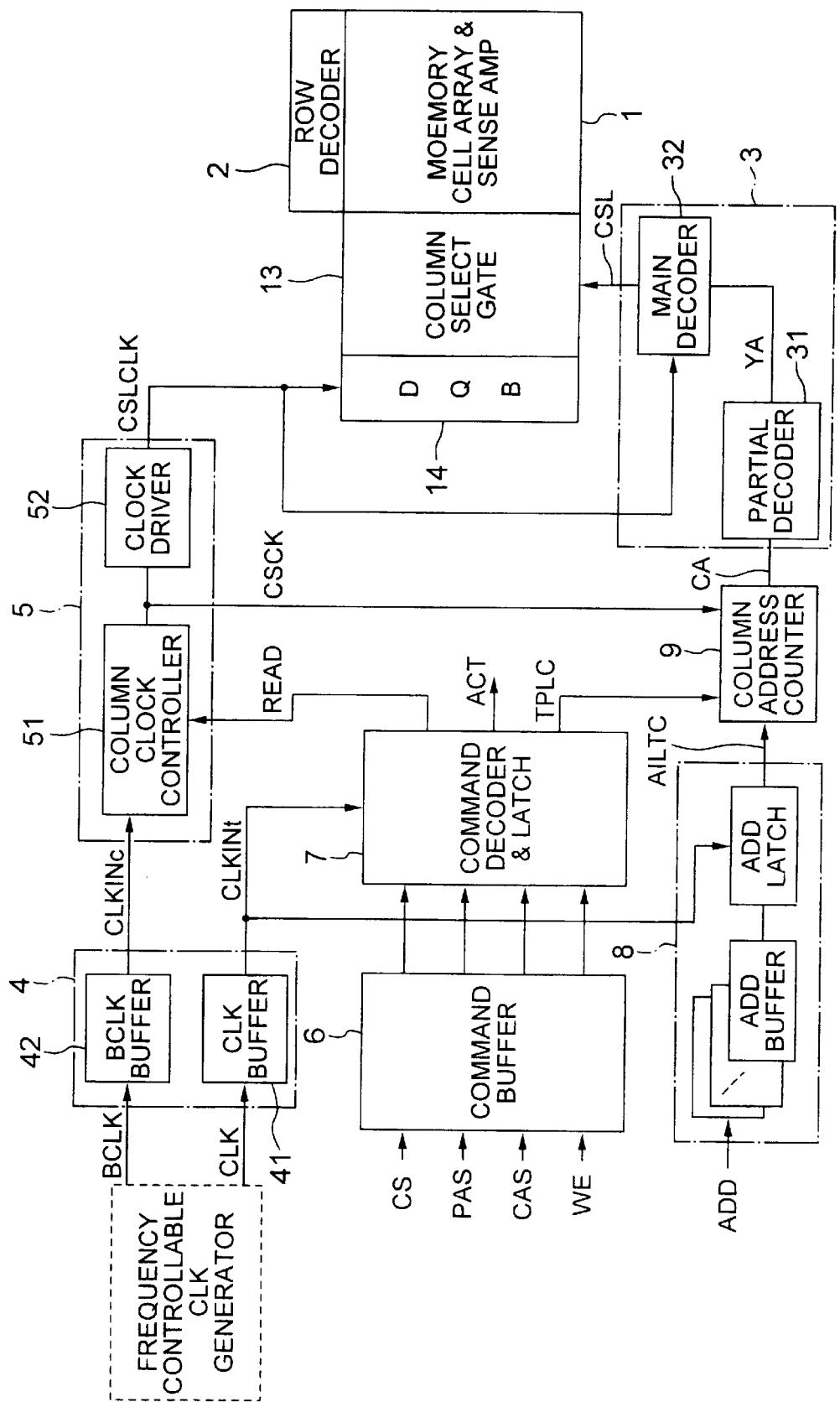
FIG. 1 is a view showing the configuration of SDRAM according to an embodiment of this invention.
Figure 2:
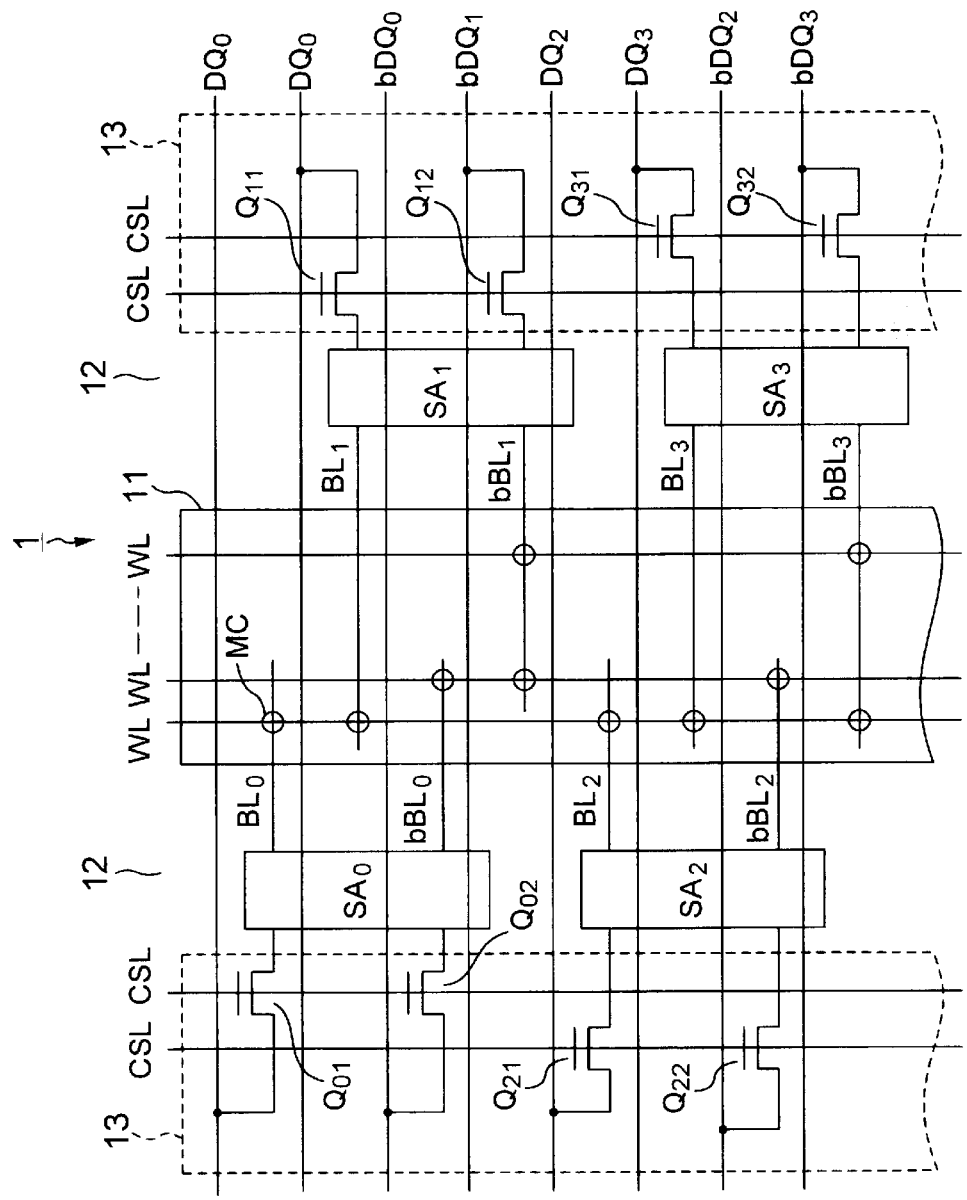
FIG. 2 is a view showing the configuration of memory cell array section of the above-mentioned embodiment.

FIG. 1 shows, in a block form, the configuration of an SDRAM according to one embodiment of this invention, and FIG. 2 shows a more practical configuration of the memory cell array thereof. As shown in FIG. 2, the memory cell array 1 is of a structure such that a plurality of bit line pairs BL, bBL(hereinafter b denotes bar, i.e. inverted logic) and a plurality of word lines WL are disposed in an intersecting (crossed) manner and dynamic type memory cells MC are disposed at respective intersecting portions. Ordinarily, the memory cell array 1 is disposed in the state divided into plural sub cell arrays, and FIG. 2 shows one sub cell array 11 thereof.

In the memory cell array 1, bit line sense amplifiers 12 are disposed at both sides of the sub cell array in a manner such that the sub cell array 11 is put therebetween. Moreover, a plurality of main data line pairs DQ, bDQ are disposed above the memory cell array 1, and the bit line pairs BL, bBL are selected by column select gates 13 so that they are connected to the main data line pairs DQ, bDQ. Data of the main data line pair DQ, bDQ are amplified by a data line buffer 14, and are further read out through peripheral data lines RD and output buffers although not shown in the figure. The word lines WL and the bit lines BL, bBL of the memory cell array 1 are respectively selected by a row decoder 2 and a column decoder 3.

In this embodiment, as clock signals used for synchronization control of data read and write operations, there are prepared reference clock signal CLK and bar clock signal BCLK complementary thereto. These clock signals CLK, BCLK are respectively taken in by a CLK buffer 41 and a BCLK buffer 42 of a clock signal buffer 4 so that internal clock signals CLKINt, CLKINc are provided.

Various commands such as chip select CS, row address strobe RAS, column address strobe CAS and write enable WE for instructing read/write operations are taken into a command decoder 7 through a command buffer 6 and are decoded thereat. The command decoder 7 latches command in response to rising edge of the internal clock signal CLKINt. External address ADD is similarly taken into an address buffer 8 in response to rising edge of the internal clock signal CLKINt and is latched. The external address ADD thus latched is controlled by clock signal and is taken out to address bus AILTC. The address bus AILTC is an address bus common to row and column.

The address taken into the address bus AILTC is decoded by the row decoder 2 and the column decoder 3. Thus, word line/bit line selection is made. In FIG. 1, elements for the column line selection are indicated in detail and elements for the row system for carrying out word line selection is briefly indicated. At the command decoder 7, initially, control signal ACT of the row system is generated with rising edge of the clock signal CLKINt being as reference. Thus, row address is taken in and is decoded. In the case of data read operation, after the row system is caused to be active, the read control signal READ and the column address taking-in (fetch) control signal TPLC are generated at the command decoder 7 with rising Adge of the clock signal CLKINt being as reference.

In the column clock signal generating circuit 5, at a column clock signal controller 51, a first column control signal CSCK is generated by logical operation of read control signal READ and the internal clock signal CLKINc of the bar clock signal BCLK. This column control signal CSCK is further delayed by a predetermined time by a clock signal driver 52. Thus, second column control signal CSLCLK is obtained.

Column address is taken into an address counter 9 by a column address taking-in (fetch) control signal TPLC, and is counted up by the first column control signal CSCK. As a result, column addresses CA of the number responsive to the number of burst length for determining bow many bits are outputted are generated. The column address CA thus generated is decoded as a last column address YA which selects desired one of respective column select lines CSL by a partial column decoder 31 in the column decoder 3. This column address YA is decoded by a main decoder 32 in synchronism with the column control signal CSLCLK generated from the clock signal generating circuit 5. Thus, a desired column select line CSL is caused to be active.

Figure 3:
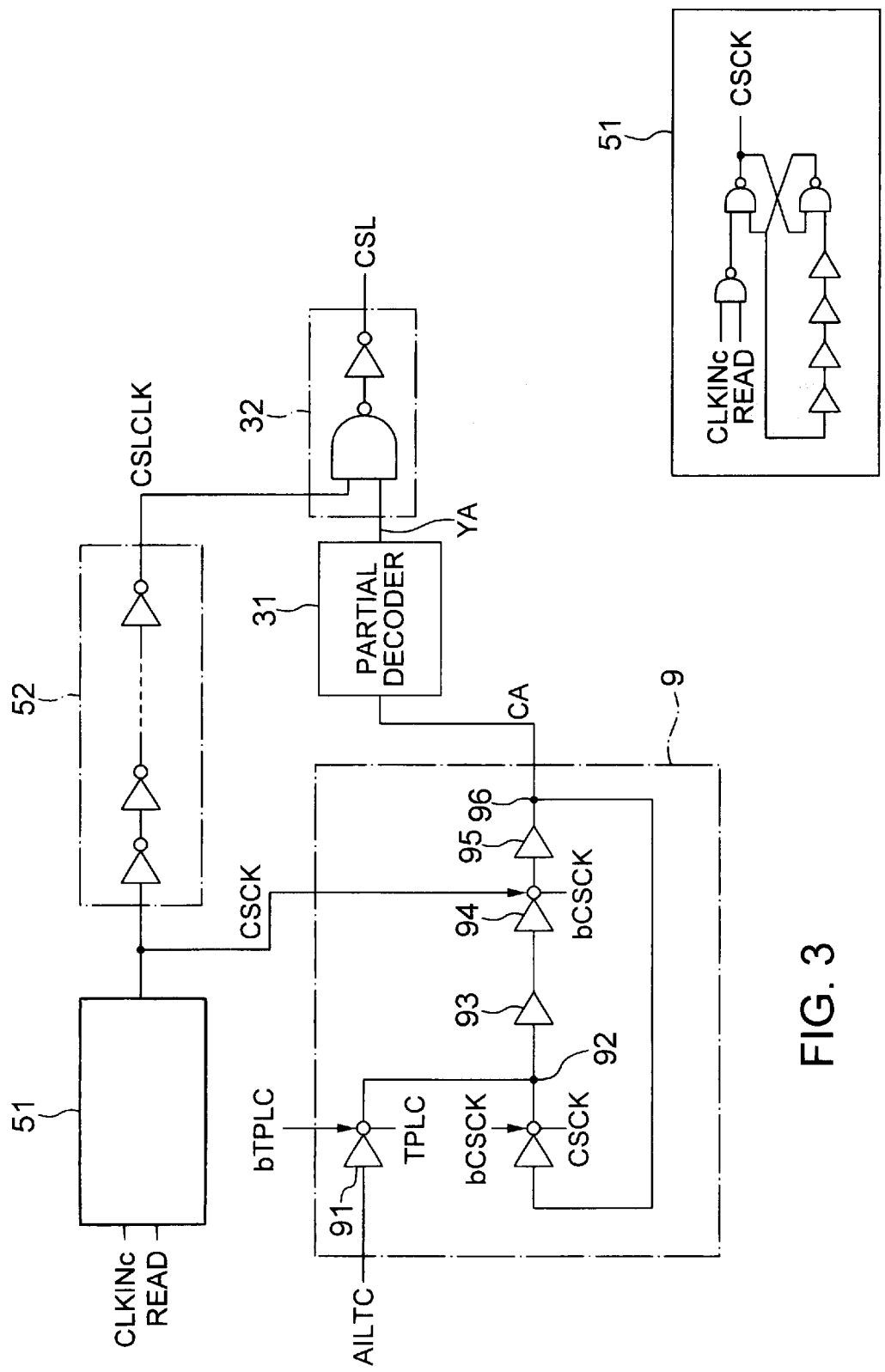
FIG. 3 is a view showing a more practical configuration of the essential part in FIG. 1.

FIG. 3 shows a more practical configuration of the essential part of the column decoder 3 and the column system clock signal generating circuit 5 of FIG. 1. The column clock signal controller 51 basically provides logical product of read control signal READ and internal clock signal CLK-TNc to generate column control signal CSCK. The detailed construction of the column clock signal controller 51 is shown in FIG. 10. According to this figure, an AND gate to produce logical product of CLKINC and READ, and a flip-flop in which one input side has an inverter chain.

The clock signal driver 52 generates column control signal CSLCLK obtained by delaying, by a predetermined time, the column control signal CSCK by plural stages of inverters.

At the address counter 9, column address on the address bus AILTC is taken into a node 92 by a tri-state CMOS buffer 91 controlled by the column address taking-in (fetch) control signal TPLC. The column address taken into this node 92 is transferred to an output node 96 through a buffer 93, a tristate CMOS buffer 94 controlled by the column control signal CSCK and a buffer 95. In addition, this column address is taken out as a predetermined number of column addresses CA by count-up by the column control signal CSCK. At the main column decoder 32, by logical product of the column control signal CSLCLK and the last column address YA, the column select line CSL is caused to be active. The column control signal CSLCLK is supplied also to the data line buffer 14 as shown in FIG. 1.

Figure 4:
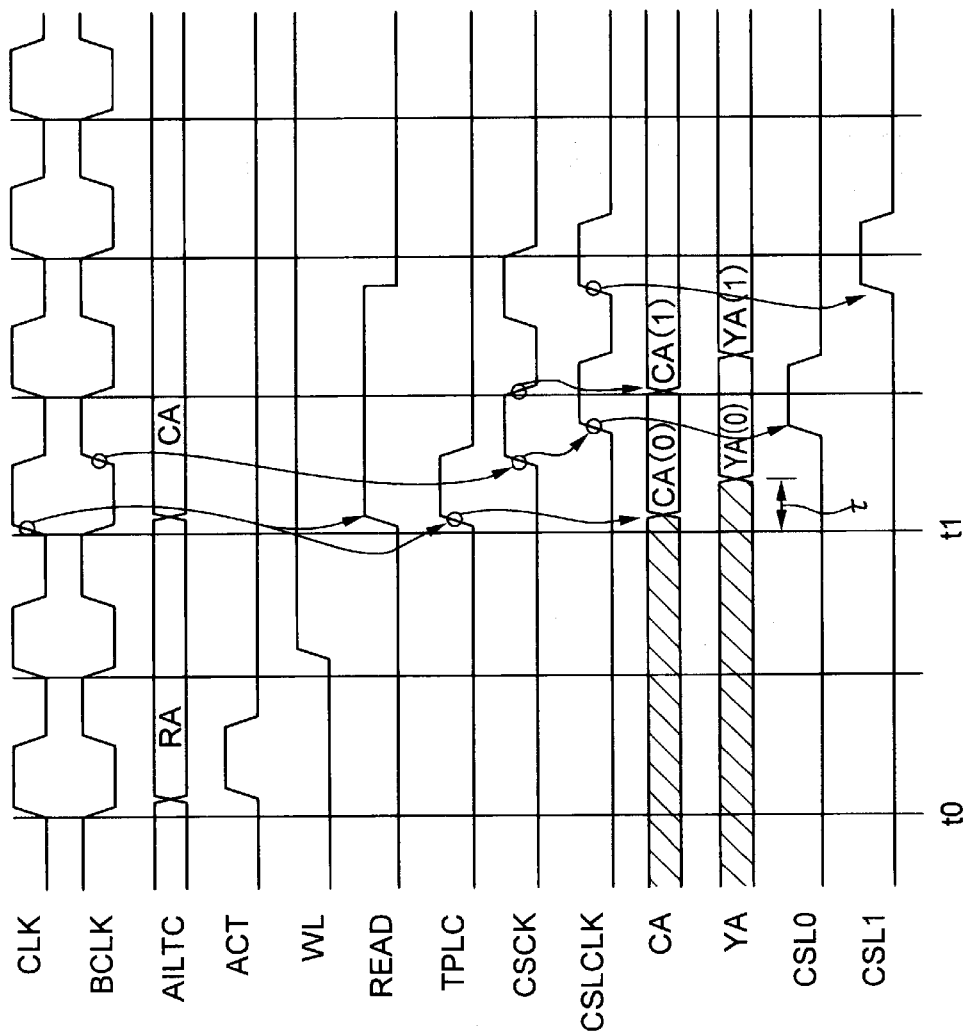
FIG. 4 is a timing diagram of data read operation at SDRAM of the above-mentioned embodiment.

FIG. 4 is a timing diagram of data read operation in this embodiment. As shown in the figure, row address RA is taken in at time to of rising edge (i.e., leading end) of the reference clock signal CLK. A control signal ACT is generated in response to the row address RA. As a result, the row address is decoded. Thus, the word line WL is selected.

The read control signal READ and the column address taking-in control signal TPLC are generated with time t1 which is rising edge of the reference clock signal CLK being as reference at time delayed by, e.g., 2 clock signals from the row address taking-in (fetch) operation. Thus, external column address CA is taken in by control signal TPLC.

For a time period during which the column address thus taken in is passed through the address counter 9 and is transferred to a node 96 as it is, since the column control signal CSCK is at "L" level and Thereafter, the column address is counted up by column control signal CSCK generated with the rising edge of the bar clock signal BCLK (i.e., trailing end of the reference clock signal CLK) being as reference. As a result, column addresses CA(0), CA(1) are prepared in succession. These column addresses CA(0), CA(1) are further decoded, and last column addresses YA(0), YA(1) are obtained.

Furthermore, by performing logical product of the column addresses YA(0), YA(1) thus obtained and column control signal CSLCLK generated at timing slightly delayed from the column control signal CSCK, different column select lines CSL0, CSL1 are selected and driven in sequence.

As stated above, in this embodiment, reference timing for taking in (fetching) column address is caused to be rising edge of reference clock signal CLK, and reference timing for generating column control signals CSCK. CSLCLK is caused to be falling edge of the reference clock signal CLK. Thus, there is no possibility that the time margin is reduced by delay time adjustment of column control signal with respect to established timing of internal column address as in the prior art. As a result, adjustments of established timing of internal column address and timing of column control clock signal can be made by period adjustment of clock signal.

This will be described in more practical sense with reference to FIGS. 5 and 6.

Figure 5:
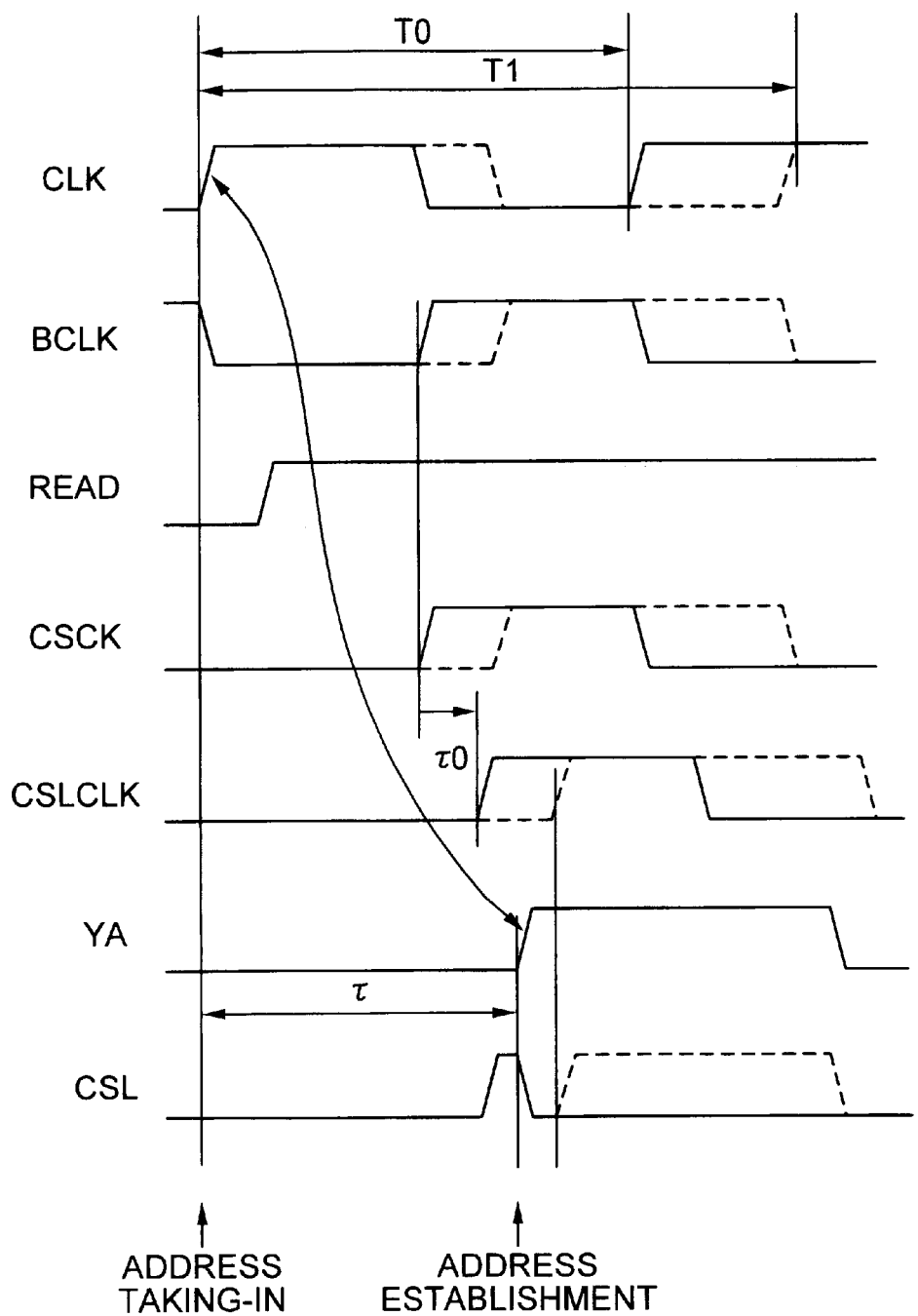
FIG. 5 is a timing diagram showing a more practical example of clock signal period adjustment in the above-mentioned embodiment.

FIG. 5 shows, on an enlarged scale, timings of main signals in the timing diagram shown in FIG. 4. For the clock signal period T0 indicated by solid line, the column control signal CSLCLK rises earlier than the delay time τ from rising edge of the reference clock signal CLK up to establishment of the internal column address YA. In this case, the column select signal CSL indicated by solid line is erroneously selected. Hitherto, in order to prevent such an erroneous selection, delay time T0 from occurrence of the column control signal CSCK to occurrence of column control signal CSLCLK was adjusted.

On the contrary, in this embodiment, clock signal period is elongated from T0 to T1 as indicated by broken lines. Thus, delay time τ from rising edge of the reference clock signal CLK up to establishment of column address is caused to be as it is, and the column control signals CSCK, CSLCLK generated with falling edge of the reference clock signal CLK being as reference are delayed, thereby making it possible to generate column control signal CSLCLK after establishment of column address YA. As a result, correct column select signal CSL can be obtained.

Figure 6:
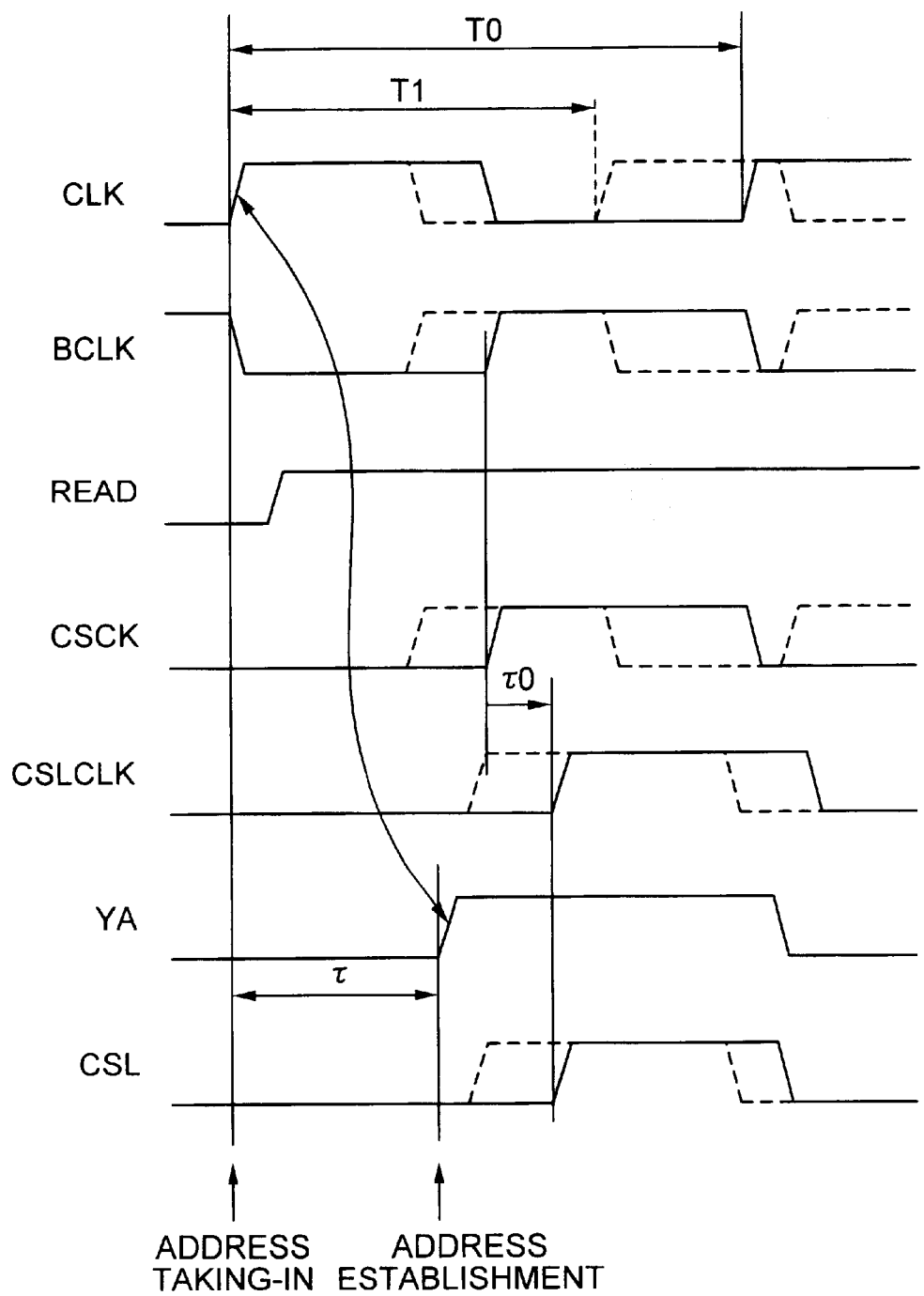
FIG. 6 is a timing diagram showing another more practical example of a clock signal period adjustment in the above-mentioned embodiment.

FIG. 6 shows the example where when clock signal period is T0 as indicated by a solid line, occurrence timing of the column control signal CSLCLK is too late with respect to established timing of column address YA although it is not erroneous selection. In this case, clock signal period is reduced to value T1 as indicated by broken lines. Thus, occurrence of the column control signal CSLCLK is caused to be early, thus making it possible to generate the column select signal CSL immediately after the column address is established. Namely, reduction of cycle time and access time can be made.

As stated above, in accordance with this embodiment, by adjustment of clock signal period, timing of the column control signal CSLCLK can be adjusted so that it is located at optimum position in point of time with respect to timing of column address establishment. Further, reduction of cycle time and access time can be made. In addition, in the case of the conventional method of carrying out internal column address establishment and timing adjustment of column control signal by delay time adjustment of column control signal, when clock signal period is reduced, access margin would be reduced, whereas in the case of this embodiment, there is no possibility that the access margin is reduced This point will now be described with reference to FIGS. 7 and 8.

Figure 7:
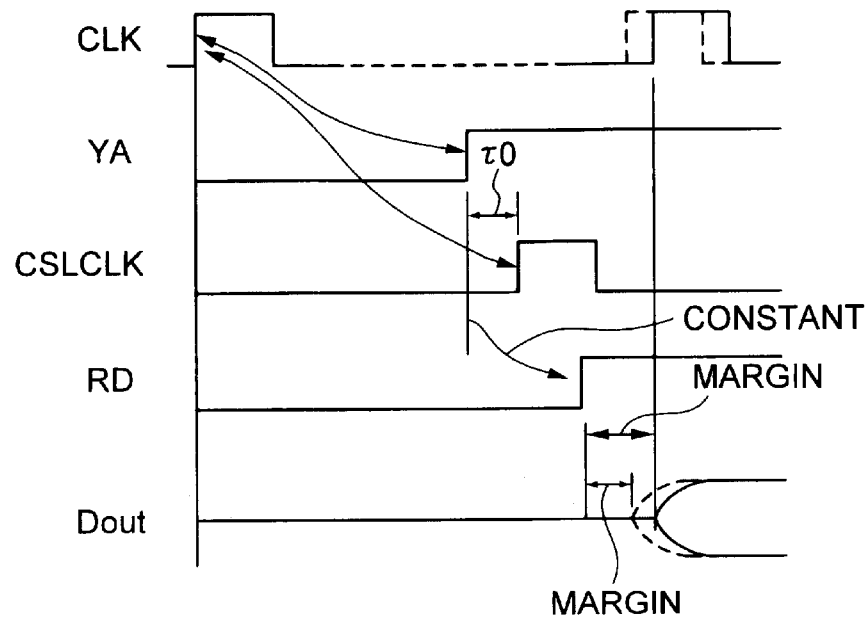
FIG. 7 is a timing diagram for explaining decreasing of access margin in the case where period of clock signal is shortened in the conventional system.

FIG. 7 shows the case of the conventional system, wherein the column control signal CSLCLK is generated with a predetermined delay time τ0 after the internal column address YA is established. In this case, the time from establishment of the internal column address YA until the column select line CSL is caused to be active so that data is transferred to the peripheral data line RD is constant. output buffer is controlled in response to rising edge of clock signal CLK. Thus, margin until data transferred to the peripheral data line RD is taken out as data output Dout becomes small in the case where clock signal period is shortened as indicated by broken lines.

Figure 8:
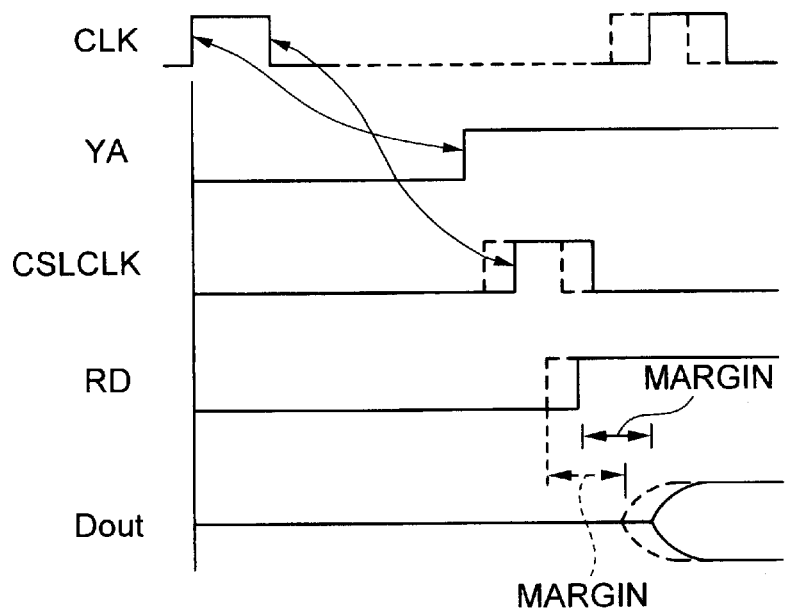
FIG. 8 is a timing diagram showing the state where access margin is not changed in the case where clock signal period is shortened by this embodiment.

On the contrary, in the case of this embodiment, the operation is as indicated in FIG. 8. In the state where clock signal period is long as indicated by solid line, the time from establishment of the internal column address YA to occurrence of the column control clock signal CSLCLK results in wasteful time. In view of the above, in order to nullify such wasteful time, clock signal period is assumed to be shortened as indicated by broken lines. At this time, occurrence timing of the column control clock signal CSLCLK becomes early, data transfer to the peripheral data line RD becomes fast, and timing of data output Dout also becomes early. Namely, timings of the entirety all become early, and access margin in the case where clock signal period is long and that in the case where clock signal period is short are not changed. Namely, access time and cycle time can be shortened without reducing access margin.

In order to shift the timing of the column control clock signal, it is necessary to change the period of the clock signal which is externally supplied. For this purpose, a clock generator 60 shown by a broken line and provided outside of this device may be a variable frequency or frequency controllable clock generator.

Such frequency control may preferably be performed on the basis of latency.

Figure 9:
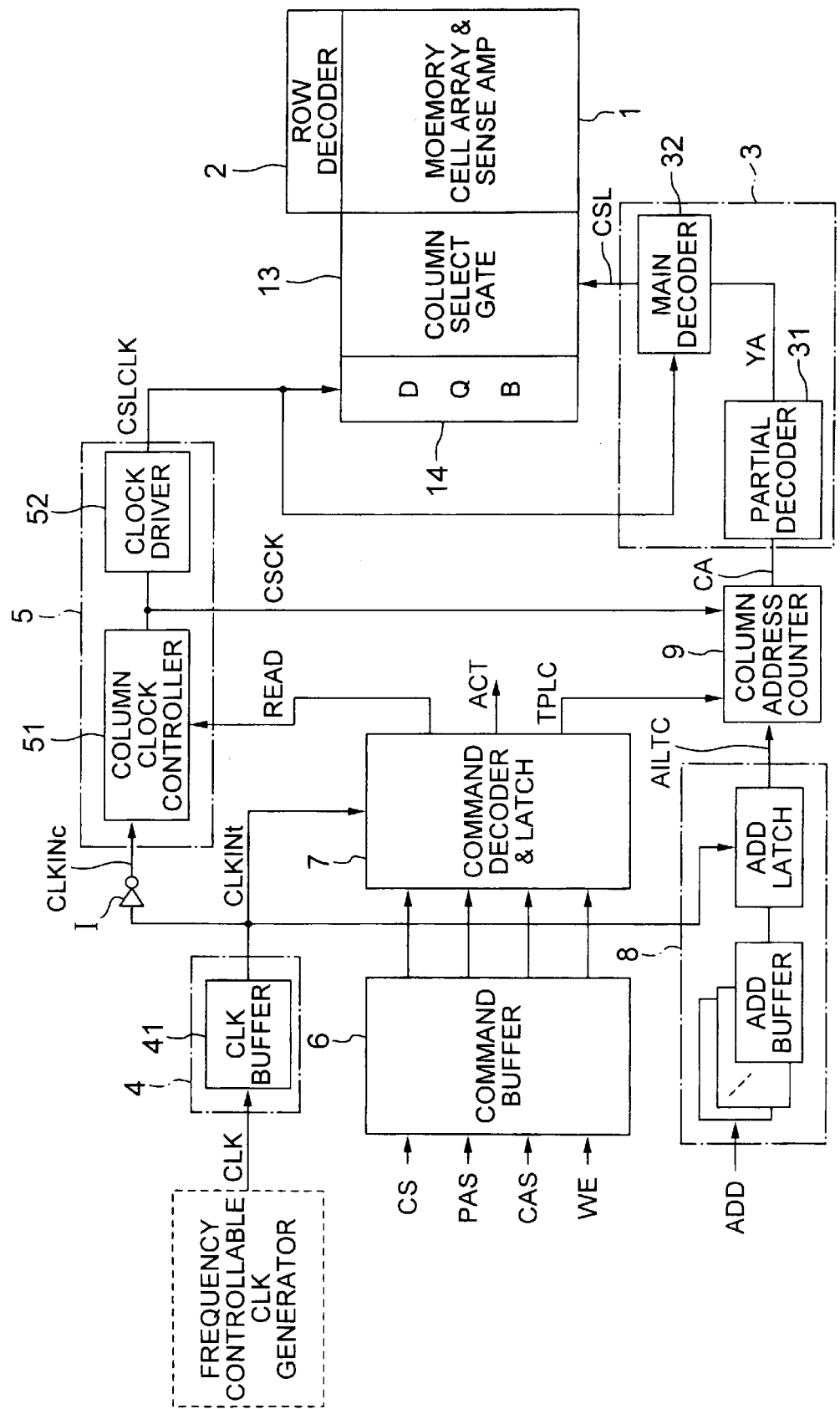
FIG. 9 is a view showing the configuration of SDRAM of another embodiment of this invention.

FIG. 9 shows an SDRAM of another embodiment of this invention. The configuration of this embodiment is similar to the previously described embodiment, and the same reference numerals as those of FIG. 1 are respectively attached to the portions corresponding to those in FIG. 1 and detailed description will be omitted. While the bar clock signal BCLK is used in the previously described embodiment, only reference clock signal CLK is used in this embodiment. In this embodiment, the internal clock signal CLKINt which has been taken in by clock signal buffer 4 is inverted by inverter I to obtain a complementary clock signal CLKINC corresponding to the bar clock signal BCLK in the previously described embodiment. Further, with rising timing of this clock signal CLKINc being as reference, the column control signals CSCK, CSLCLK are generated. In addition, other portions of this embodiment are not changed with respect to the previously described embodiment.

Also by the this embodiment, effects or advantages similar to the previously described embodiment can be obtained.

As described above, in accordance with this invention, it is possible to provide a synchronous semiconductor memory device easy in timing adjustment of column selection and capable of reducing cycle time and access time to the minimum value without reducing access margin.

What is claimed is:

1. A synchronous semiconductor memory device comprising:

a memory cell array having memory cells disposed in matrix form and operating on the basis of a clock signal;

a plurality of word lines;

a plurality of column lines;

a row decoder for designating an address of the word lines;

a column control signal generating circuit for generating a column control signal;

a first clock buffer coupled to receive a system clock signal from an external source and for outputting a first clock signal;

a second clock buffer coupled to receive and invert the system clock signal and for outputting a second clock signal which is a complementary signal of the first clock signal; and a column decoder for designating a column address of the column lines in response to the column control signal;

wherein fetching said column address is performed in synchronism with a leading end of the first clock signal and the column control signal is generated in synchronism with a leading end of the second clock signal.

* * * * *